(12) United States Patent
Chen

(10) Patent No.: US 10,549,680 B2
(45) Date of Patent: *Feb. 4, 2020

(54) MOBILITY SCOOTER AND WHEEL THEREOF

(71) Applicant: E-Link Technology Co., Ltd, Shenzhen (CN)

(72) Inventor: Yufeng Chen, Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/231,501

(22) Filed: Dec. 22, 2018

(65) Prior Publication Data

US 2019/0193628 A1     Jun. 27, 2019

(30) Foreign Application Priority Data

Dec. 22, 2017   (CN) .................. 2017 2 1814924 U

(51) Int. Cl.
| | | |
|---|---|---|
| *B60Q 1/32* | (2006.01) | |
| *F21S 4/28* | (2016.01) | |
| *G02B 5/08* | (2006.01) | |
| *H05K 1/02* | (2006.01) | |
| *B62J 6/20* | (2006.01) | |
| *F21V 7/05* | (2006.01) | |
| *B60Q 1/00* | (2006.01) | |

(52) U.S. Cl.
CPC .......... *B60Q 1/326* (2013.01); *B60Q 1/0041* (2013.01); *B62J 6/20* (2013.01); *F21S 4/28* (2016.01); *F21V 7/05* (2013.01); *G02B 5/08* (2013.01); *H05K 1/0274* (2013.01); *B60B 2900/571* (2013.01); *B60B 2900/572* (2013.01)

(58) Field of Classification Search
CPC ......... B60Q 1/326; B60Q 1/0041; F21V 7/05; B62J 6/20; F21S 4/28; B60B 2900/572; B60B 2900/571
See application file for complete search history.

(56) References Cited

U.S. PATENT DOCUMENTS

| | | | | |
|---|---|---|---|---|
| 3,789,208 A | * | 1/1974 | Lewis .................... | A63C 17/26 |
| | | | | 362/103 |
| 4,298,910 A | * | 11/1981 | Price .................... | A43B 3/0005 |
| | | | | 280/11.19 |
| 4,363,502 A | * | 12/1982 | Bakerman .............. | A63C 17/26 |
| | | | | 280/816 |

(Continued)

*Primary Examiner* — Donald L Raleigh
(74) *Attorney, Agent, or Firm* — ZANIP

(57) ABSTRACT

A wheel of a mobility scooter includes a wheel body provided with a light emitting module. The light emitting module includes an LED lamp bar, a plane mirror and a two-way mirror. The LED lamp bar is disposed between the plane and two-way mirrors. Mirror surfaces of the plane and two-way mirrors face the LED lamp bar therebetween. A perspective surface of the two-way mirror faces an outer side of the wheel. Through optical characteristics of the two-way mirror and the plane mirror, a real image of the LED lamp is reflected back and forth between the two mirrors for infinite times. From the perspective surface, a black hole illusion that LED lamps extend indefinitely into the wheel one after another can be seen, so that the interior of the wheel presents a hollow visual effect which is eye-catching, thereby increasing the product attractiveness and improving the market competitiveness.

10 Claims, 4 Drawing Sheets

(56) References Cited

U.S. PATENT DOCUMENTS

| | | | |
|---|---|---|---|
| 5,278,733 A * | 1/1994 | St. Thomas | A63C 17/26 280/11.19 |
| 5,294,188 A * | 3/1994 | Vancil, Jr. | A63C 17/26 280/11.19 |
| 2013/0228989 A1 | 9/2013 | Horst et al. | |
| 2018/0029431 A1 | 2/2018 | Tang et al. | |
| 2018/0162478 A1 | 6/2018 | Silverwood | |

* cited by examiner

MOBILITY SCOOTER AND WHEEL THEREOF

CROSS-REFERENCE TO RELATED APPLICATIONS

This application claims priority to Chinese Patent Application No. 201721814924.0 with a filing date of Dec. 22, 2017. The content of the aforementioned applications, including any intervening amendments thereto, are incorporated herein by reference.

TECHNICAL FIELD

The disclosure relates to the field of mobility scooters, and particularly relates to a mobility scooter and a wheel thereof.

BACKGROUND OF THE PRESENT INVENTION

With the improvement of human living standard, people have higher and higher aesthetic demands for products. Nowadays, as a common means of transportation and entertainment in life, mobility scooters are designed to have light emitting wheels by many manufacturers. The light emitting wheels, especially at night, are very ornamental and popular to users. At present, the practice of the light emitting design of the wheels for most of the mobility scooters is to install LED lamps on the wheels to make the wheels have a light emitting effect. However, this light emitting effect is single; and the light emitting effect and ornamental value need to be improved.

Thus, the prior art needs to be improved and enhanced.

SUMMARY OF PRESENT INVENTION

Aiming at the defects, of the prior art, the purpose of the disclosure is to provide a mobility scooter having ornamental light effect and a wheel for realizing the light effect.

To solve the above technical problems, the disclosure adopts the following technical solutions:

A wheel for a mobility scooter is provided, including a wheel body; the wheel body is provided with a light emitting module; the light emitting module includes an LED lamp bar, a plane mirror and a two-way mirror; the LED lamp bar is disposed between the plane mirror and the two-way mirror; mirror surfaces of the plane mirror and the two-way mirror face the LED lamp bar therebetween; and a perspective surface of the two-way mirror faces an outer side of the wheel.

Further, the light emitting module further includes a bracket; the bracket is embedded into the wheel body; and the LED lamp bar, the plane mirror and the two-way mirror are installed on the bracket.

The wheel further includes a conductive module; the conductive module includes a conductive spring pin and a conductive PCB: the conductive spring pin is disposed on a hub of the wheel body; the conductive spring pin is electrically connected with the conductive PCB; and the conductive PCB is electrically connected with the LED lamp bar.

Further, the wheel body is further provided with a motor; and the conductive module is electrically connected with a power supply of the motor.

Further, the light emitting module is disposed at one side or both sides of the wheel body.

Further, the LED lamp bar is provided with a plurality of uniformly distributed LED lamps; and the LED lamp bar is bent into a ring.

Further, the bracket is provided with a transparent protecting plate for protecting the light emitting module; and the transparent protecting plate is positioned on an outer side of the two-way mirror.

Further, a through hole is defined in a center part of the transparent protecting plate; and a decorative hood matched with the transparent protecting plate is disposed in the through hole of the transparent protecting plate.

The disclosure also provides a mobility scooter, including a frame; and the frame is provided with the above wheel.

In some embodiments, the mobility scooter may be a swing car, a balance car, an electric scooter or a remote control scooter.

Compared with the prior art, the disclosure provides a mobility scooter and a wheel thereof. The wheel includes the wheel body. The wheel body is provided with the light emitting module. The light emitting module includes the LED lamp bar, the plane mirror and the two-way mirror. The LED lamp bar is disposed between the plane mirror and the two-way mirror. Mirror surfaces of the plane mirror and the two-way mirror face the LED lamp bar therebetween. A perspective surface of the two-way mirror faces the outer side of the wheel. In the disclosure, through optical characteristics of the two-way mirror and the plane mirror, a real image of the LED lamp is reflected back and forth between the two mirrors for infinite times. From the perspective surface of the two-way mirror, a black hole illusion that LED lamps extend indefinitely into the wheel one after another can be seen, so that the interior of the wheel presents a hollow visual effect which is eye-catching, thereby increasing the product attractiveness and improving the market competitiveness.

Furthermore, the disclosure only uses one group of LED lamps to achieve a visual effect that plurality groups of LED lamps coexist, thereby relatively reducing power consumption while enhancing the ornamental value, reducing battery burden and facilitating stable endurance of the mobility scooter.

DETAILED DESCRIPTION OF PREFERRED EMBODIMENTS

To make the purpose, technical solution and advantages of the disclosure more clear, the disclosure is further described below in detail in combination with the accompanying drawings and embodiments. It should be understood that specific embodiments described herein are only used for explaining the disclosure, not for limiting the disclosure.

It should be noted that, when a component is "installed", "fixed" or "disposed" on another component, the component can be directly on, another component or a middle component may coexist. When a component is "connected" to another component, the component can be directly connected to another component or a middle component may coexist.

It should also be noted that, the terms of left, right, upper and lower and other orientation words in the embodiments of the disclosure are only relative concepts to each other or refer to the normal use state of the product, and should not be considered to be restrictive.

Figure 1:
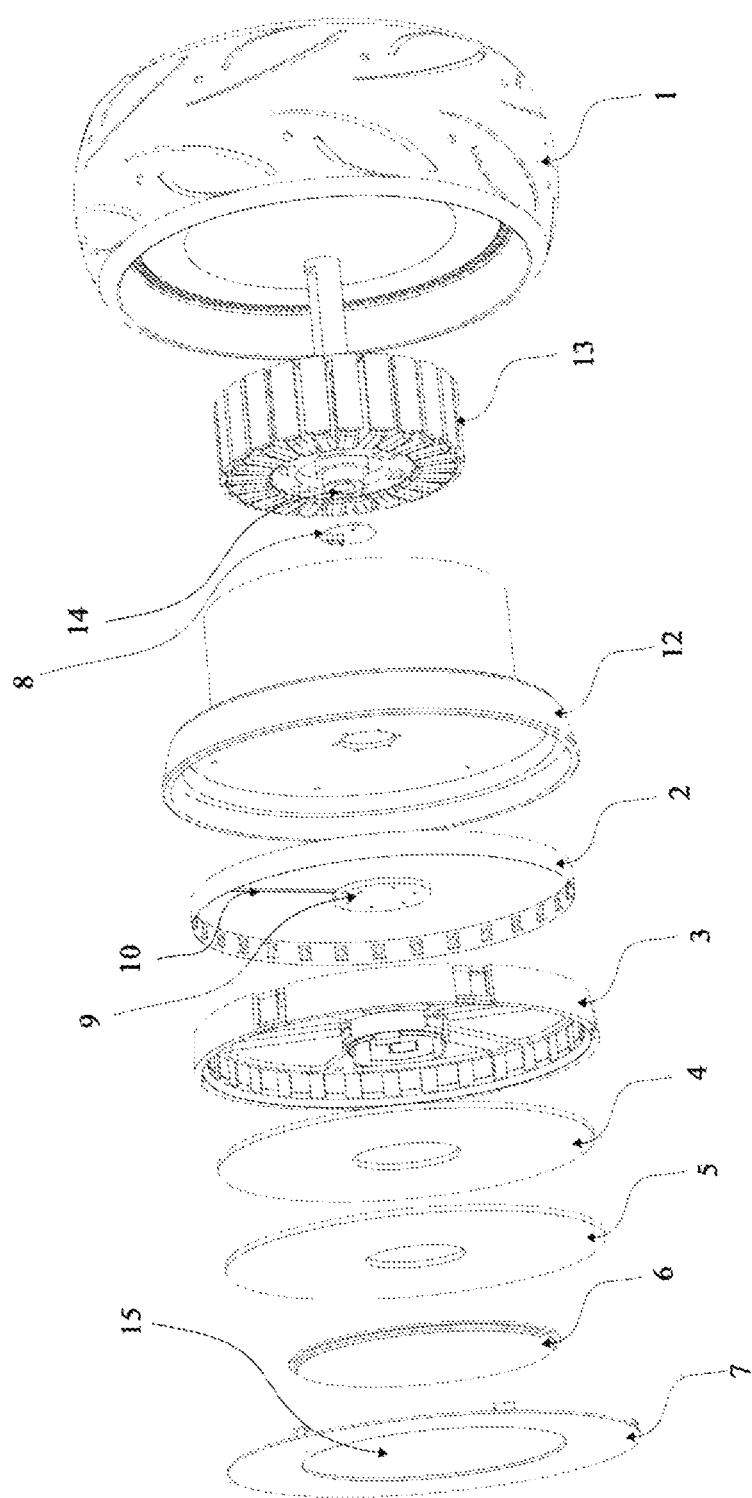
FIG. 1 is an exploded view of a wheel for a mobility scooter according to the disclosure.

As shown in FIG. 1, a wheel of a mobility scooter according to the disclosure includes, a wheel body 1. The wheel body 1 is provided with a light emitting module (not labelled in the figure). The light emitting module includes an LED lamp bar 2, a plane mirror 4 and a two-way mirror 5.

Figure 2:
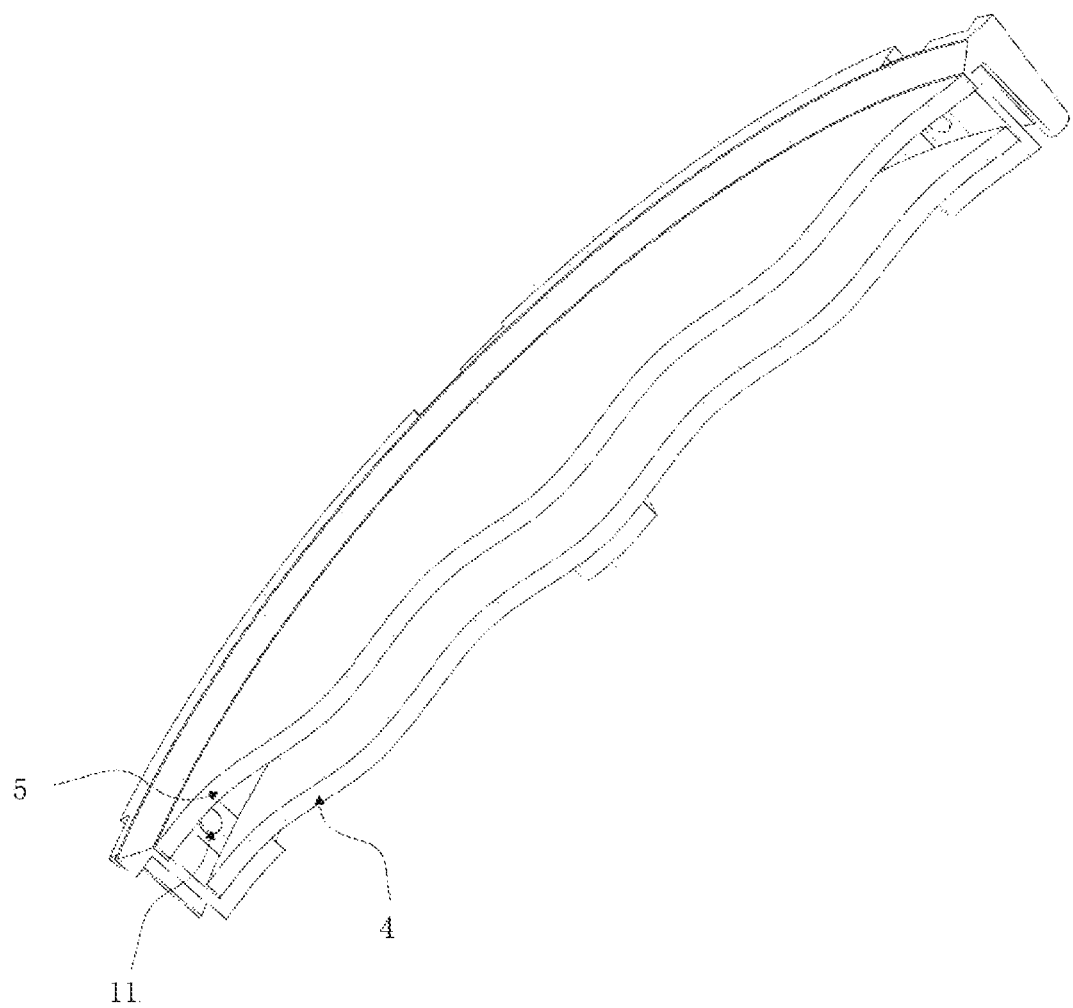
FIG. 2 is a sectional view of a light emitting module of the wheel according to the disclosure.
Figure 3:
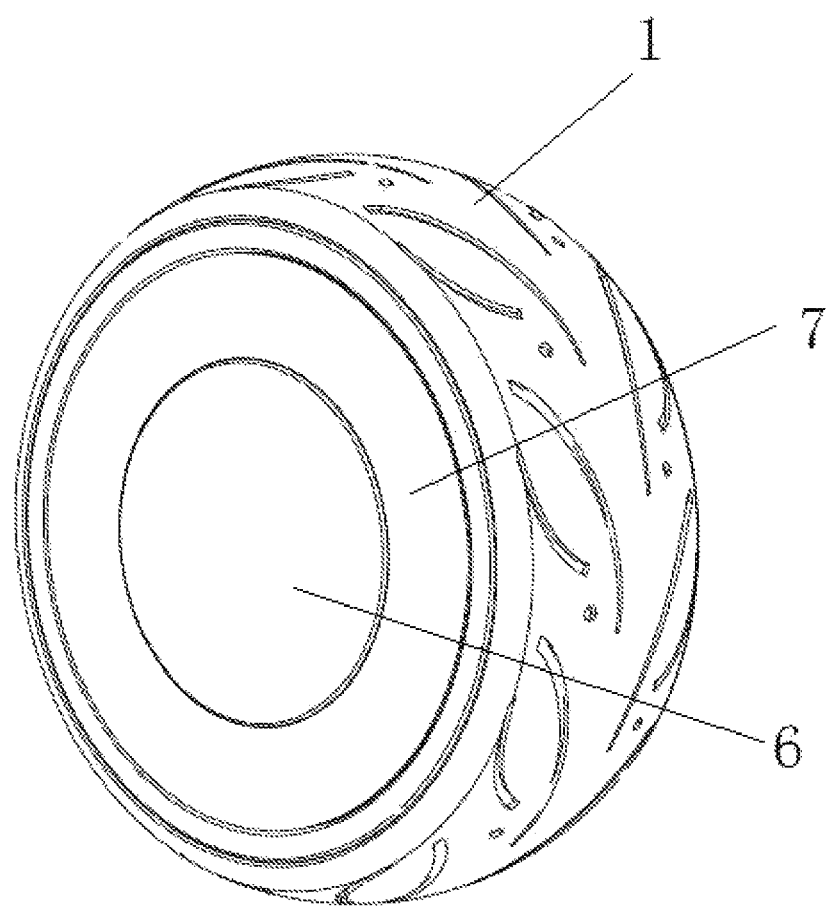
FIG. 3 is a schematic diagram of an overall appearance of the wheel according to the disclosure.
Figure 4:
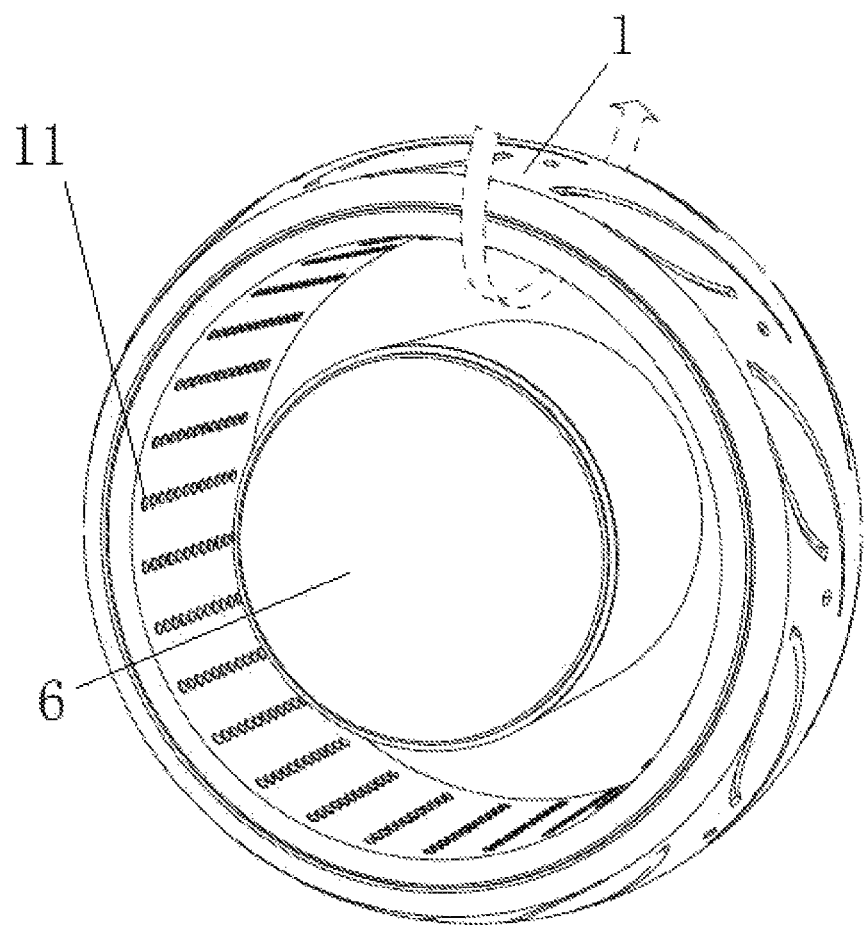
FIG. 4 is a schematic diagram of a light emitting effect of the wheel according to the disclosure.

As shown in FIG. 2, FIG. 3 and FIG. 4, the LED lamp bar 2 is disposed between the plane mirror 4 and the two-way mirror 5. Mirror surfaces of the plane mirror 4 and the two-way mirror 5 face the LED lamp bar 2 therebetween. When an LED lamp 11 is electrified to emit light, a mirror image of the LED lamp (i.e., a real image of the LED lamp) is reflected back and forth between the mirror surfaces of the plane mirror 4 and the two-way mirror 5 for infinite times, so as to generate a visual effect of spatial extension. A perspective surface of the two-way mirror 5 faces an outer side of the wheel. The light emitting effect, on the wheel is reflected to the outside. In the view of observers, when the wheel is stationary, plurality groups of LED lamps 11 on the wheel extend into the wheel one after another in endless circles, so that the interior of the wheel presents a hollow visual effect. When the wheel is rotating, circles of light on the wheel extend into the wheel one after another indefinitely, thereby bringing a psychedelic visual feeling, increasing human purchase desire for the product, enhancing use experience of users for the product (especially visual and psychological enjoyment) and facilitating the improvement of the market competitiveness.

In specific implementation, the light emitting module may be disposed at one side or both sides of the wheel body 1, so that one side or both sides of the wheel body have the hollow effect.

Referring to FIG. 1, preferably, the light emitting module further includes a bracket 3; the bracket 3 is in a wheel-like shape and is embedded into the wheel body 1; and the LED lamp bar 2, the plane mirror 4 and the two-way mirror 5 are installed on the bracket 3. By means of the specific bracket 3, the light emitting module can be smoothly fixed to the wheel body 1.

Preferably in the present embodiment, the plane mirror 4 and the two-way mirror 5 are both in circular structure, and are matched with the bracket 3. Such structural arrangement can not only save material and reduce cost, but also weaken the stress concentration, caused by the vibration in the operation of the mobility scooter, thereby guaranteeing the reliability of lenses.

Specifically, the plane mirror 4, the LED lamp bar 2 and the two-way mirror 5 are successively embedded on the bracket 3, thereby guaranteeing that the plane mirror 4 and the two-way mirror 5 are not loosened during operation of the mobility scooter and facilitating the protection of the lenses against damage.

Correspondingly, the wheel for the mobility scooter according to the disclosure further includes a conductive module (not labelled in the figure). The conductive module includes a conductive spring pin 8 and a conductive PCB 9. The conductive spring pin 8 is disposed on a hub 12 of the wheel body 1. The conductive spring, pin 8 is electrically connected with the conductive PCB 9. The conductive PCB 9 is electrically connected with the LED lamp bar 2.

Further, the wheel body 1 is further provided with a motor 13. The conductive module is electrically connected with a power supply 14 of the motor 13. In the present embodiment, the conductive spring pin 8 disposed on the hub 12 of the wheel body 1 and the motor 13 disposed at the other side of the hub 12 share the power supply 14. The conductive PCB 9 is installed on the bracket 3, and is fixed to the wheel body 1 together with the bracket 3. The conductive PCB 9 is in lap joint to the LED lamp bar 2 on the bracket 3 through a thin strip 10 which may be a wire, a flat cable or a flexible printed circuit (FPC), and is electrically connected with the LED lamp bar 2. In this way, the occupation space of the conductive module in the wheel body 1 can be reduced. Moreover, the LED lamp bar 2 directly gets electricity from the motor 13, and is turned on and turned off together with the motor 13. All functions can be completed only by one action of the user, thereby facilitating user's operation, saving a power supply module for the light emitting module and reducing production cost.

Of course, in other embodiments, the conductive PCB 9 can also be directly electrically connected with a mainboard of the mobility scooter, and directly gets electricity through the mainboard. When the mobility scooter is started, the LED lamp is illuminated. The disclosure does not limit the manner for getting electricity for the conductive PCB 9.

By referring to FIG. 1, FIG. 3 and FIG. 4, preferably, the LED lamp bar 2 in the present embodiment is provided with a plurality of uniformly distributed LED lamps 11. The LED lamps 11 are arranged into a row. The LED lamp bar 2 is bent into a ring and is adhered into the inner side of a wheel edge of the wheel-shaped bracket 3. Such arrangement manner, instead of the existing arrangement of installing the LED lamp 11 on a wheel spoke or embedding in a tire, can ensure that the LED lamp 11 produces the above light emitting effect in a limited wheel body space.

Further, the bracket 3 in the present embodiment is also provided with a transparent protecting plate 7 for protecting the light emitting module. The transparent protecting plate 7 is positioned on an outer side of the two-way mirror 5. In the present embodiment, the transparent protecting plate 7 is clamped with the bracket 3, and the surface of the transparent protecting plate 7 is flush with the outer edge of the wheel body 1, so as to protect the light emitting module against external disturbance without affecting aesthetics and visibility of the light emitting effect.

Further, a through hole 15 is also defined in a center part of the transparent protecting plate 7 in the present embodiment. A decorative hood 6 matched with the transparent protecting plate 7 is disposed in the through hole 15 of the transparent protecting plate 7. The decorative hood 6 is installed on the transparent protecting plate 7 through a buckle to shield component structures at an inner side, which is beneficial for keeping the overall aesthetics of the mobility scooter.

Based on the wheel of the mobility scooter, the disclosure also provides a mobility scooter which includes a frame. The frame is also provided with the above wheel of the mobility scooter. Because the wheel with a special light effect is disposed in the mobility scooter, the overall mobility scooter has ornamental value and is beneficial for enhancing the market competitiveness of the product. In some embodiments, the mobility scooter may be a swing car, a balance car, an electric scooter or a remote control scooter. Other components of the mobility scooter belong to the prior art, and thus will not be repeated herein.

Compared with the prior art, the disclosure provides a mobility scooter having ornamental light effect and a wheel for realizing the light effect. When the mobility scooter is started, the LED lamp on the wheel is electrified to emit light, and a mirror image of the LED lamp is reflected back and forth between the mirror surfaces of the plane mirror and the two-way mirror, so as to generate a visual effect of spatial extension. The perspective surface of the two-way mirror faces the outer side of the wheel. The light emitting effect on the wheel is reflected to the outside. In the view of observers, when the wheel is stationary, plurality groups of LED lamps on the wheel extend into the wheel one after another in endless circles, so that the interior of the wheel presents a hollow visual effect. When the wheel is rotated, circles of light on the wheel extend into the wheel one after another indefinitely, thereby bringing a psychedelic visual feeling, increasing human purchase desire for the product, enhancing use experience of the user for the product (especially visual and psychological enjoyment) and facilitating the improvement of the market competitiveness.

Furthermore, in the above embodiment, the plane mirror and the two-way mirror are both in circular structure, and are matched with the bracket. Such structural arrangement can not only save material and reduce cost, but also weaken the stress concentration, caused by the vibration in the operation of the mobility scooter, thereby guaranteeing the reliability of lenses. Meanwhile, the wheel-shaped bracket guarantees that the plane mirror and the two-way mirror are not loosened during operation of the mobility scooter and, facilitates the protection of the lenses, against damage. The matching arrangement between the transparent protecting plate and the decorative hood protects the light emitting module against external disturbance without affecting visibility of the light emitting effect, and is beneficial for keeping the overall aesthetics of the mobility scooter and provides guarantee for the stable and reliable light emitting effect of the mobility scooter and the wheel thereof.

It can be understood that, for those of ordinary skill in the art, equivalent replacements or changes may be made according to the technical solution of the disclosure and the conception of the disclosure. All of these changes or replacements shall belong to the protection scope of the appended claims of the disclosure.

I claim:

1. A wheel for a mobility scooter, comprising a wheel body, wherein the wheel body is provided with a light emitting module; the light emitting module comprises an LED lamp bar, a plane mirror and a two-way mirror; the LED lamp bar is disposed between the plane mirror and the two-way mirror; mirror surfaces of the plane mirror and the two-way mirror face the LED lamp bar therebetween; and a perspective surface of the two-way mirror faces an outer side of the wheel.

2. The wheel according to claim 1, wherein the light emitting module further comprises a bracket; the bracket is embedded into the wheel body; and the LED lamp bar, the plane mirror and the two-way mirror are installed on the bracket.

3. The wheel according to claim 1, further comprising a conductive module, wherein the conductive module comprises a conductive spring pin and a conductive PCB; the conductive spring pin is disposed on a hub of the wheel body; the conductive spring pin is, electrically connected with the conductive PCB; and the conductive PCB is electrically connected with the LED lamp bar.

4. The wheel according to claim 3, wherein the wheel body is further provided with a motor; and the conductive module is electrically connected with a power supply of the motor.

5. The wheel according to claim 1, wherein the light emitting module is disposed at one side or both sides of the wheel body.

6. The wheel according to claim 1, wherein the LED lamp bar is provided with a plurality of uniformly distributed LED lamps; and the LED lamp bar is bent into a ring.

7. The wheel according to claim 2, wherein the bracket is provided with a transparent protecting plate for protecting the light emitting module; and the transparent protecting plate is positioned on an outer side of the two-way mirror.

8. The wheel according to claim 7, wherein a through hole is defined in a center part of the transparent protecting plate; and a decorative hood matched with the transparent protecting plate is disposed in the through hole.

9. A mobility scooter, comprising a frame, wherein the frame is provided with the wheel of according to claim 1.

10. The mobility scooter according to claim 9, wherein the mobility scooter is a swing car, a balance car, an electric scooter or a remote control scooter.

* * * * *